United States Patent [19]

Watanabe

[11] Patent Number: 4,976,613
[45] Date of Patent: Dec. 11, 1990

[54] HEAT TREATMENT APPARATUS

[75] Inventor: Shingo Watanabe, Kanagawa, Japan

[73] Assignee: Tel Sagani Limited, Japan

[21] Appl. No.: 249,780

[22] Filed: Sep. 26, 1988

[30] Foreign Application Priority Data

Sep. 29, 1987 [JP] Japan .................................. 62-242497
Jan. 27, 1988 [JP] Japan .................................. 63-14642

[51] Int. Cl.$^5$ ............................................. F27D 3/12
[52] U.S. Cl. .................................... 432/241; 432/253; 432/11
[58] Field of Search ............... 432/241, 239, 153, 253, 432/5, 6, 11; 414/925, 931

[56] References Cited

U.S. PATENT DOCUMENTS

| 4,543,059 | 9/1985 | Whang et al. | 432/11 |
| 4,610,628 | 9/1986 | Mizushina | 432/241 |
| 4,738,618 | 4/1988 | Massey et al. | 432/241 |
| 4,770,590 | 9/1988 | Hugues et al. | 414/172 |

FOREIGN PATENT DOCUMENTS 58-60552  4/1983  Japan .................................. 432/241

Primary Examiner—Henry A. Bennet
Assistant Examiner—C. Kilner

[57] ABSTRACT

Disclosed is a heat treatment apparatus comprises a body having an opening section on the clear room side, a furance disposed in the body, a process tube arranged elevatably relative to the furnace, and a preventing plate arranged closably at the opening section for shutting off the opening section when it is closed, thereby it is possible to prevent dust from entering into the clean room by closing the opening section with the preventing plate. Further, disclosed is an heat treatment apparatus wherein the process tube is supported by arms, these arms being horizontally receiprocated between the space section below the furnace and position outside of the space section, where the process tube is located, while the arms are elevated and lowered so that the process tube supported on the arms is delivered to and received from the elevaotr, and the process tube is supported, elevated and lowered by the elevator, relative to the furnace, thereby it is possible to move the process tube and to mount and remove the same to and from the body without relying upon human hands, thereby it is possible to facilitate the movement operation of the process tube and enhance the economy of operation and the safety of working.

12 Claims, 10 Drawing Sheets

HEAT TREATMENT APPARATUS

The present application claims priority of Japanese Patent Applications No. 62-242497 filed on Sept.29, 1987, and No. 63-14642 filed on Jan. 27, 1988.

FIELD OF THE INVENTION AND RELATED ART STATEMENT

In manufacture of semiconductors, a vertical heat treatment apparatus adapted to be used for oxidization treatment or the like of a semiconductor wafer (referred to as "wafer" hereinafter) is arranged such that a process tube is provided to be introduced into and delivered from a furnace having an electrical heater, and a wafer boat having the wafer is provided to be inserted into the process tube.

The body of the heat treatment apparatus is arranged to confront a clear room through the intermediary of a partition in a "Through the wall" pattern for the purpose of using effectively the clean room. The region of the body on the clean room side is provided with an opening section for introducing and delivering the wafer boat.

In such a heat treatment apparatus, the above-mentioned process tube is normally set in the furnace. In wafer a substituting position, the wafer delivered by a wafer carrier in the above process is substituted onto a wafer boat for the heat treatment. Thereafter, this boat is set in the process tube in the furnace for heat treatment of the wafer.

If the above-mentioned heat treatment apparatus is used, for example, for one week, the process tube is contaminated by the adhesion of remained residue in the inner surface thereof. In order to replace the process tube with another one, the process tube is lowered out of the lowest portion of the body. Then the process tube is taken out through an opened door provided in one side section of the body.

However, during the removal and installation of the process tube, dust is produced and is scattered by fresh air fed from a clean air unit so that it enters into the clean room through the opening section, causing the problem of the contamination of the clean room.

Since the process tube is a reactive tube, the process tube must sometimes be cleaned. When the process tube is cleaned, the process tube must be removed from the furnace. In the heat treatment apparatus thus arranged, when the process tube is disposed in the furnace, the process tube is conveyed to a position in the vicinity of and outside of the space section below the furnace by means of a carrier vehicle or a fork lift. The process tube may then rest vertically in this position. Thereafter, the workers bring the process tube and transfer to the inside of the space section below the furnace, then the process tube is set on the elevator device disposed in the space section below the furnace and is elevated so as to introduced into the inside of the furnace. Further, when the process tube is taken out from the furnace, the process tube is lowered down to the space section below the furnace by the elevator device, and transferred from the inside to the outside of the space section, and the workers carry the process tube with their hands.

However, since the process tube (including parts incorporated thereto) is very heavy (about 30 kg), and therefore, one worker can hardly perform this operation where the process tube is manually transferred from the outside to the inside of the space section below the furnace and is set on the elevator and the process tube is manually transferred from the inside to the outside of the space section below the furnace. Therefore, this operation has been conventionally carried out by two workers so that the man hours required are increased, and there has been a high risk that the workers will be harmed and the process tube will be broken due to accident such as falling-down of the process tube or the like. Further, since the space section below the furnace or the inside of the frame is narrow, there has been a problem where the working by the workers is difficult so that operation is less efficient.

OBJECT AND SUMMARY OF THE INVENTION

In view of the above-mentioned matters, the present invention is devised, and therefore, the first object of the present invention is to provide a heat treatment apparatus which prevents dust produced when a process tube is taken out from entering into a furnace so that the clean room can be always held in a clean condition.

Further, the second object of the present invention is provide a heat treatment apparatus which is provided with a means for supporting the process tube and for transferring the same between the inside and outside of the space section below the furnace so as to enhance the efficiency and operation ability of the transfer the process tube, and to prevent occurrence of dangerous accidents.

According to the first invention devised to attain the above-mentioned object, there is provided a heat treatment apparatus comprising a body having an opening section on the clean room side, a furnace disposed in the body, a process tube provided so as to be relative to the furnace, and a preventing plate provided closably in the opening section so that the opening section is shut off when the preventing plate is closed.

In such a heat treatment apparatus, the preventing plate does not normally shut off the opening section, and therefore, a maintenance room inside of the body is communicated with the clean room. Further, the preventing plate shuts off the opening section when the process tube is removed or installed, so that dust produced upon removal and installation of the process tube is shielded off by the preventing plate, and therefore is prevented from entering into the clean room so that the clean room is held in a purified condition.

Further, according to the second invention, there is provided a heat treatment apparatus comprising a furnace body, a process tube adapted to be introduced into the furnace body from the lower side of the latter, a slide means having arms disposed in a space section below the furnace body and adapted to support the process tube, for horizontally reciprocating the arms between the space section below the furnace body and a position outside of the space section, where the process tube is located, a first elevating means disposed in the space section below the furnace body, for elevating and lowering the arms of the above-mentioned slide means, and a second elevating means having an elevator, for receiving and delivering the process tube supported on the arms of the slide means with the use of the elevator, and for elevating and lowering the process tube supported on the elevator, relative to the furnace body.

When, for example, the process tube is installed in the furnace body, the arm of the slide means is slid forward to the process tube on waiting outside of the space section below the furnace body, and in this phase the arms are elevated by a vertically moving operation so as to support the process tube. In this condition, the arms are slid to be retracted into the space section below the furnace body, and therefore the process tube can be conveyed by the elevator in the second elevating means, thereby making it possible to easily and safely transfer the process tube by only one worker.

DETAILED DESCRIPTION OF PREFERRED EMBODIMENT

The present invention will be explained in detail with reference to the drawings.

Figure 6:
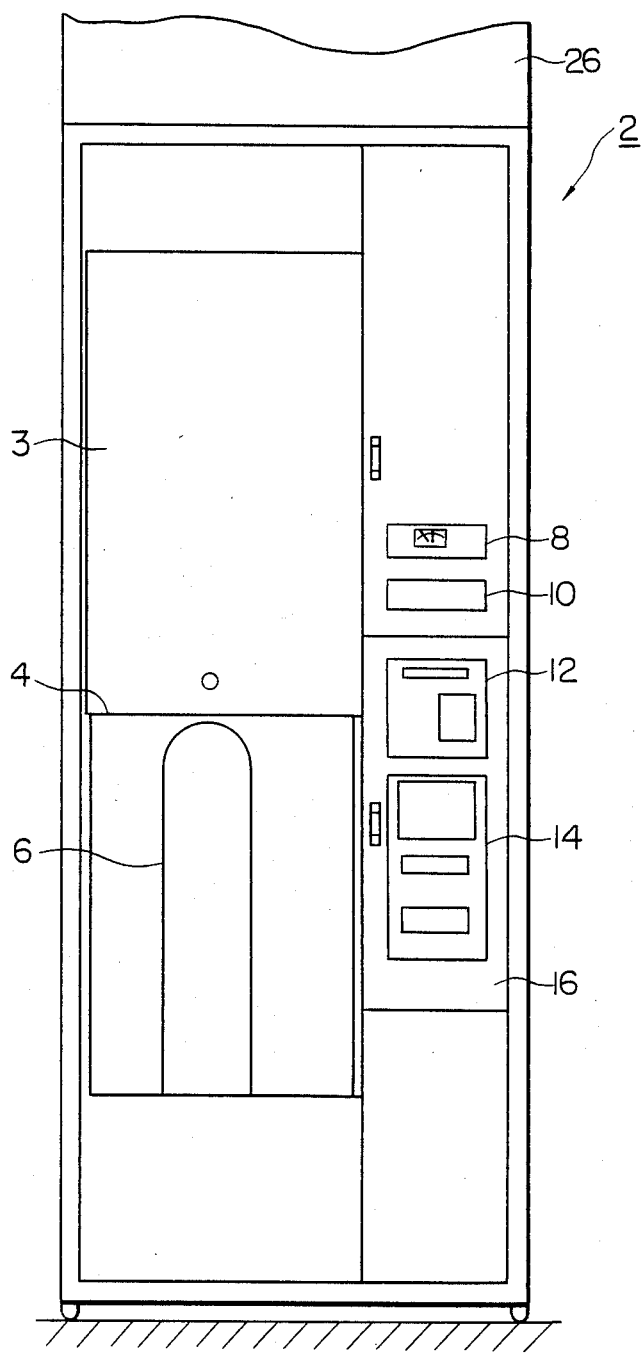
FIG. 6 is a front view illustrating the heat treatment apparatus.

As shown in FIG. 6, a panel 3 is arranged on the front face of the body 2 of a heat treatment apparatus, and an opening section 4 is formed in the panel 3. This opening section 4 communicates the inside of the body 2 with a clean room. A process tube 6 is disposed in the inside of the body 2 while a door 16 is attached to the front face of the body 2. A "Pirani vacuum gauge" 8, a remote panel 10, a temperature controller 12, and a control panel 14 are arranged on the door 16. Further, a partition 26 is provided in the upper section of the body 2. The partition 26 partitions between the maintenance room and the clean room.

Figure 7:
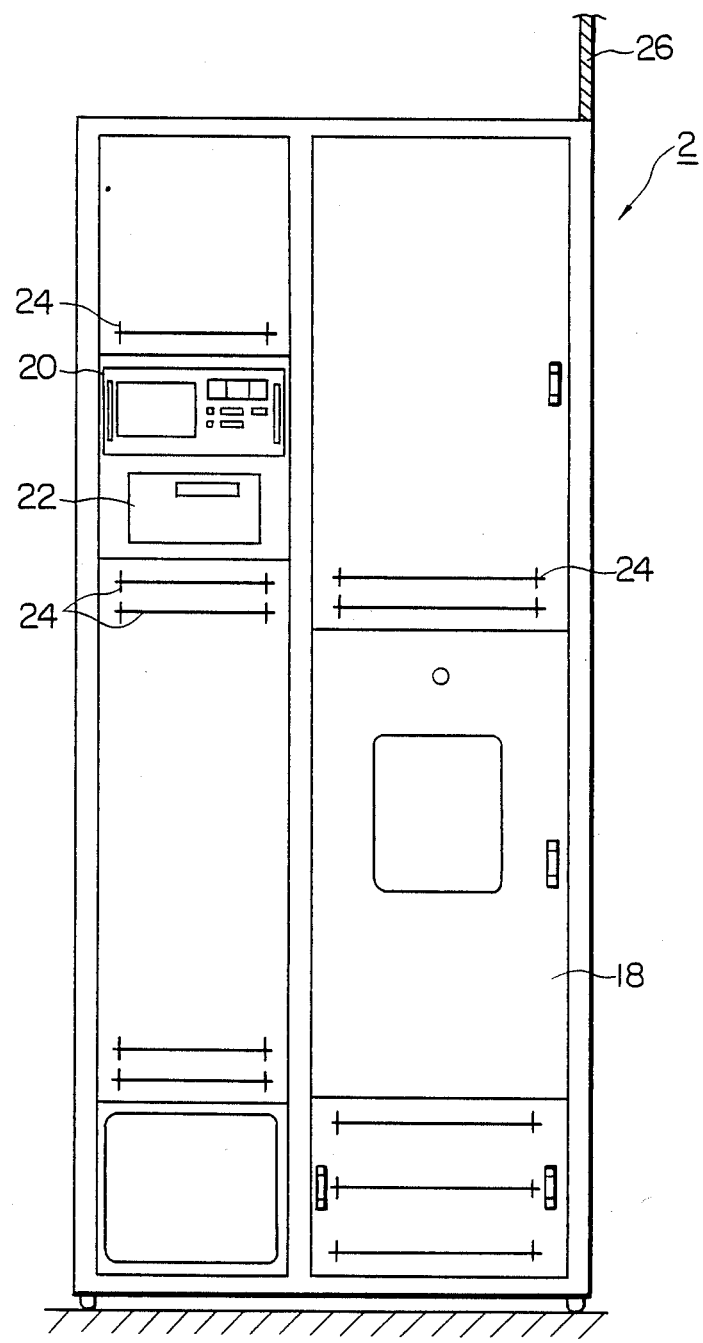
FIG. 7 is a side view illustrating the heat treatment apparatus.

As shown in FIG. 7, in addition to a maintenance door 18, a temperature controller 20 for manual operation and an elevator device controller 22 for controlling an elevator device which will be detailed hereinbelow are provided on one side face of the body together with several holes 24 formed therein.

Figure 8:
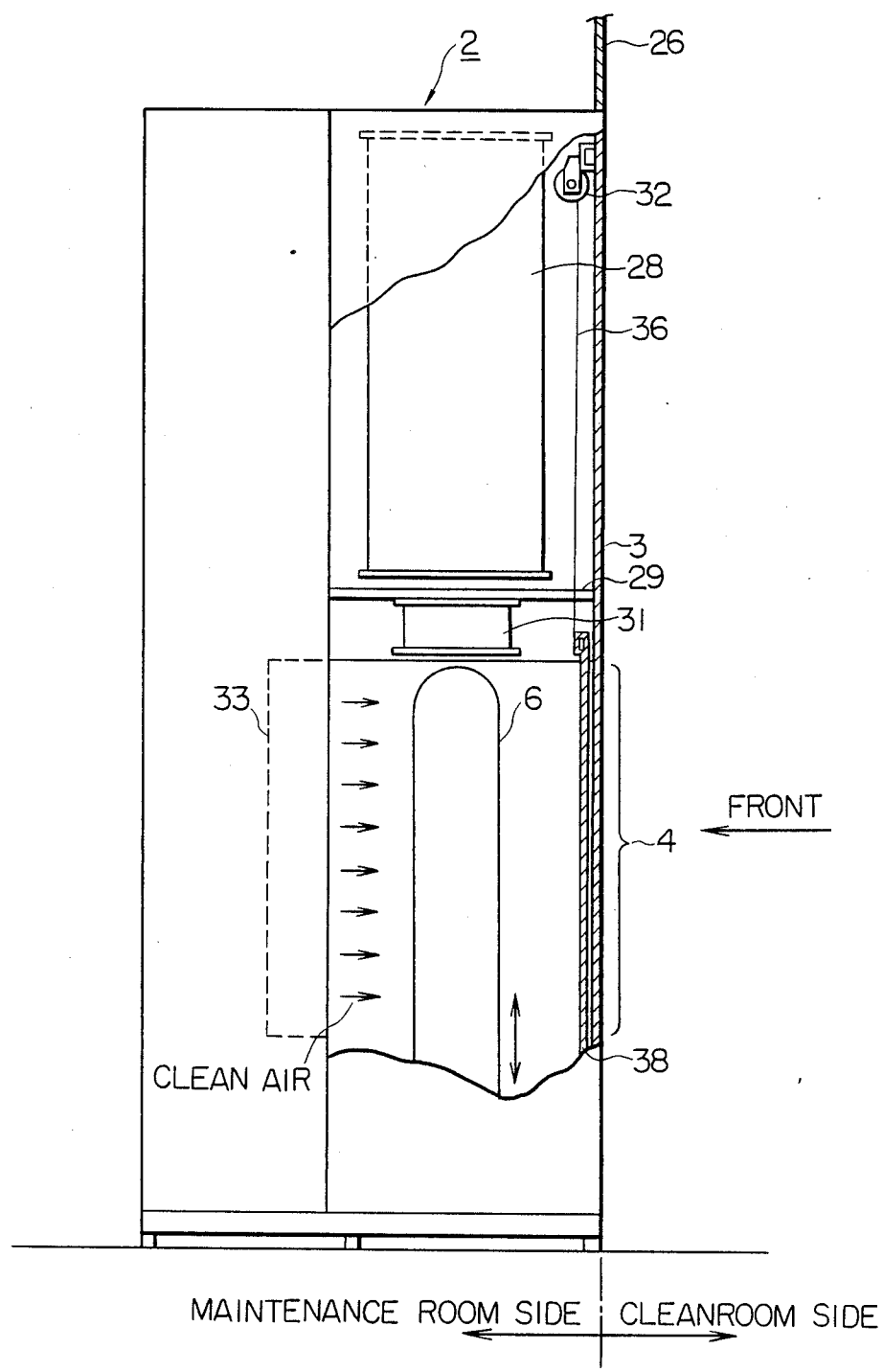
FIG. 8 is a partially broken side view illustrating the heat treatment apparatus.

As shown in FIG. 8, a furnace 28, provided vertically and cylindrically and formed as a thermal resisting type heater, is disposed in the upper section of the inside of the body 2, and is provided in the lower section thereof with a bottom plate 29, and a manifold 31, a process tube 6 made of quartz being arranged elevatably and coaxially with the furnace 28 and the manifold 31. There is provided a clean air unit 33 for feeding purified air, on the side opposing the opening section across the process tube 6.

Figure 1:
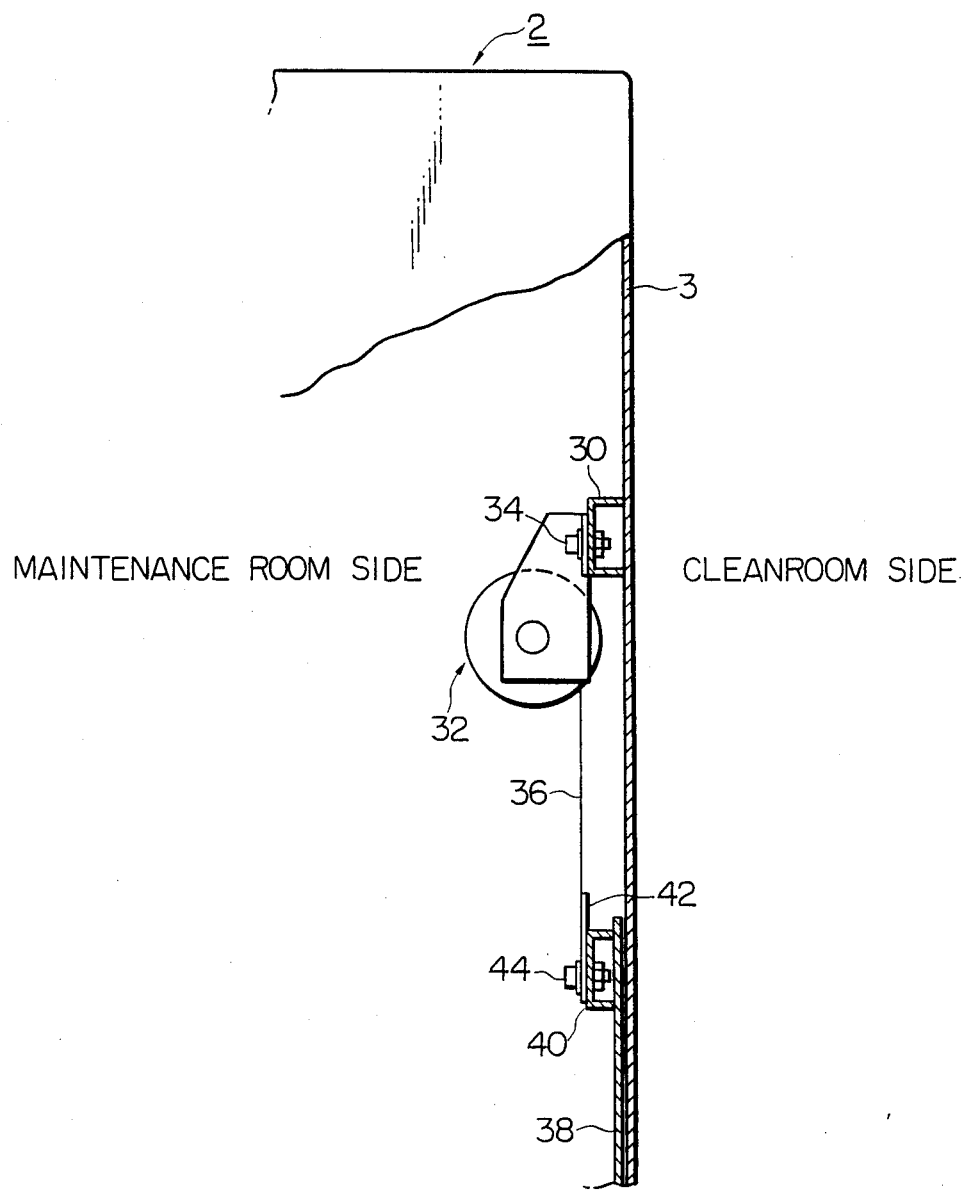
FIG. 1 is an enlarged fragmentary side view illustrating a heat treatment apparatus.
Figure 3:
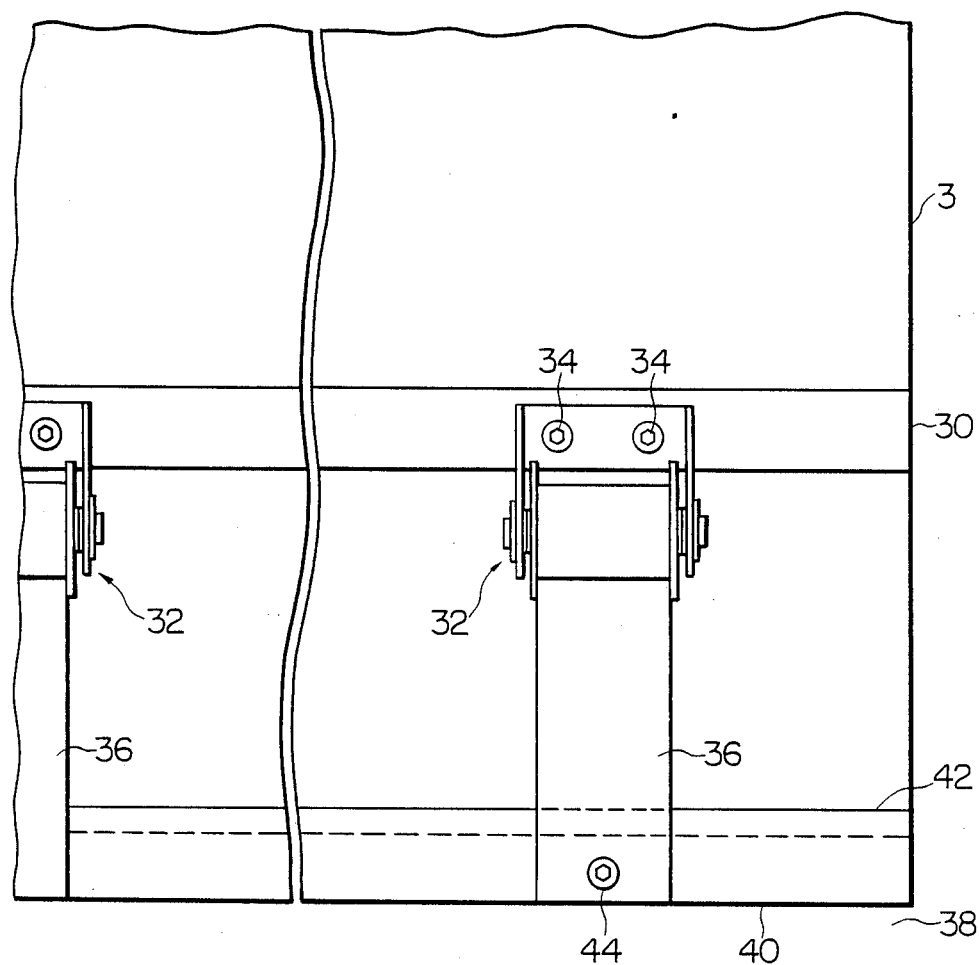
FIG. 3 is a view observing the FIG. 1 from the maintenance room side.

As shown in FIGS. 1 and 3, a convex part 30 is formed on the panel 3 of the body 3. Pulleys 32 are attached to the convex part 30 by means of bolts 34. Leaf springs 36 are wound around the pulleys 32 and are attached at one end thereof to a convex part 40 on a preventing plate 38 through the intermediary of a plate 42 by means of bolts 44.

The above-mentioned preventing plate has dimensions enough to shield the opening section 4.

Figure 4:
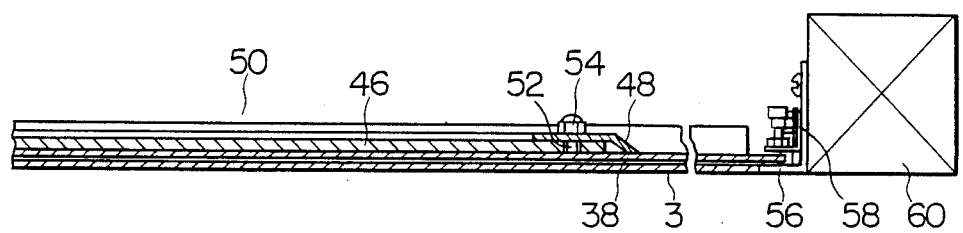
FIG. 4 is a view observing a preventing plate from the lower side.

As shown in FIG. 4, a glass panel 46, a frame member 48, and a peep window 50 are provided by means of bolts 55 and nuts 54.

Figure 5:
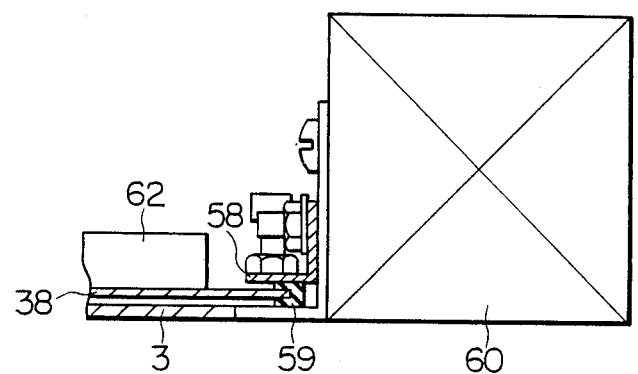
FIG. 5 is a partially enlarged view illustrating one end part of the preventing plate.

As shown in FIG. 5, a guide 58 is attached by means of bolts to an rectangular pipe 60 forming one part of the body 2. This guide 58 guides the preventing plate 38 during movement of the latter. Incidentally, there is provided a packing 59 between the guide 58 and the preventing plate 38. This packing 59 keeps the closed tightness of the inside of the body 2. Further, a handle grip 62 is projected from the lowermost end of the preventing plate 38. This handle grip 62 is gripped by a human hand so as to move the preventing plate 38.

Next the operation of the above-mentioned heat treatment apparatus will be explained.

The preventing plate 38 is stored in the inside of the body 2 above the opening section 4 for introduction and delivery of the wafers during normal process. In this condition the maintenance room in the body 2 is communicated with the clean room through the opening section 4.

Then, when the process tube 6 is removed and installed, the handle grip 62 of the preventing plate 38 is pulled down. Since the upper section of the preventing plate 38 is coupled to the leaf springs 36 wound on the pulleys 32, the leaf springs 36 are wound off from the pulleys so that both leaf springs 36 and the preventing plate 38 are moved downward when the preventing plate 38 is pulled down, and therefore, the preventing plate 38 shuts off the opening section 4 as shown in FIG. 8. In this condition, when the process tube 6 is removed and installed, even though dust is produced, the preventing plate 38 prevents the dust from entering into the clean room 1.

After the completion of the installation and removal of the process tube, when the handle grip 62 is pushed up, the leaf springs 36 are wound up by the pulleys 32 so that the preventing plate 38 is pulled up and is again stored in the upper section of the body 2.

Accordingly, since the above-mentioned heat treatment apparatus is so arranged that the preventing plate 38 is manually lowered to shut off the opening section 4 only when dust is produced due to the installation and removal of the process tube 6, even though dust is produced during the installation and removal of the process tube 6, the dust is prevented from entering into the clean room so that it is possible to always maintain the clean room in a purified condition.

Incidentally, it has been explained that the preventing plate 38 is manually moved in the above-mentioned heat treatment apparatus, but it can be moved by a drive device such as a motor or the like.

Next a mechanism for moving the process tube 6 will be explained hereinafter.

As shown in FIG. 2 and FIGS. 9 through 11, frames 66 are planted upright on a lower plate 64 laid on a floor 63, and the furnace 28 is laid on the bottom plate 29 supported by the frames 66 so that the process tube 6 can be introduced into and delivering from the inside of the body within the inside of the frames 66 or the space section below the furnace 28.

Figure 2:
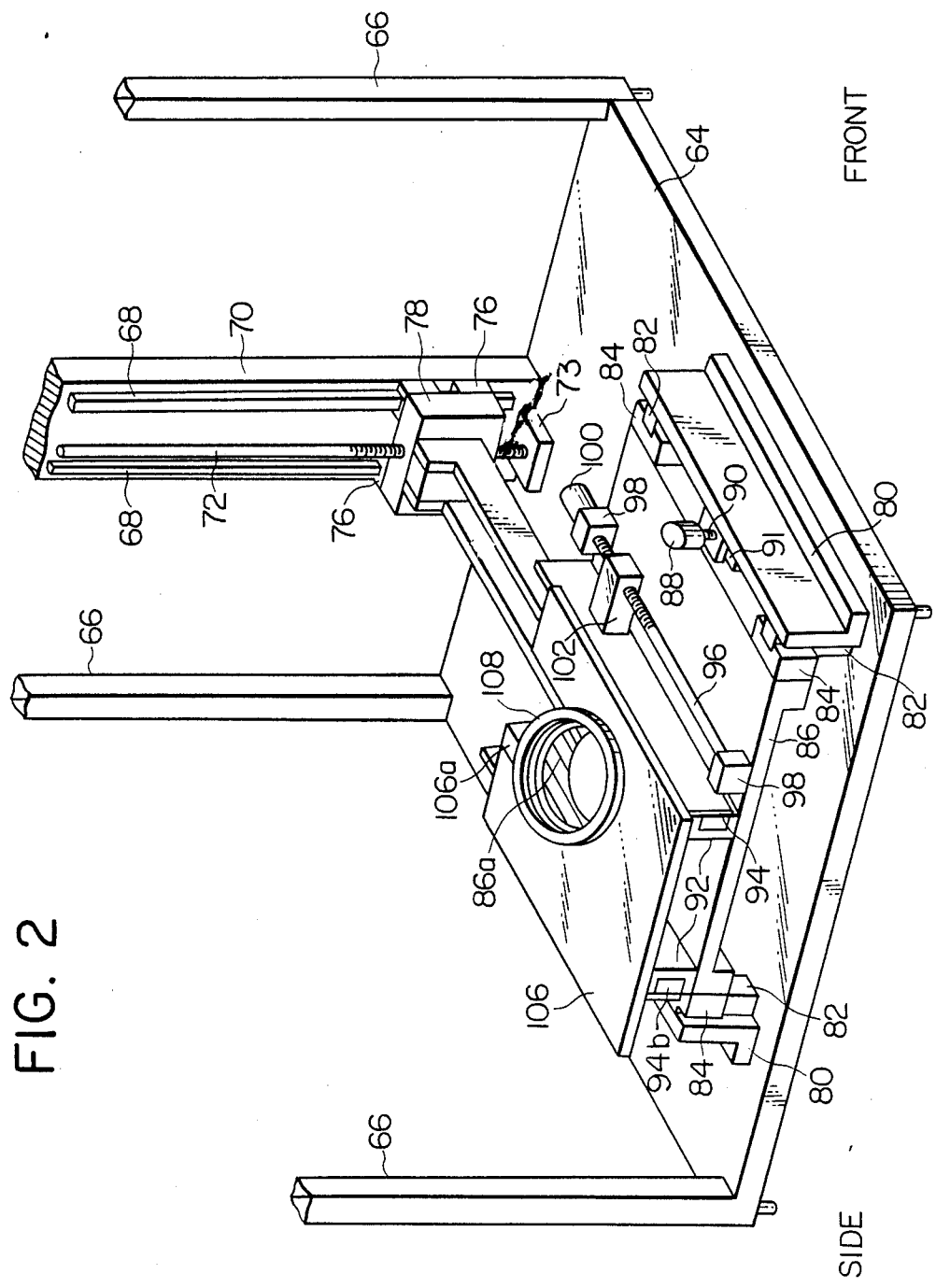
FIG. 2 is a perspective view illustrating a device for transferring a process tube in the heat treatment apparatus.

As shown in FIG. 2, a rail bed 70 on which rails 68 are attached is planted upright on the lower plate 64, and adjacent to the rail bed 70, a feed screw 72 is vertically extended, being journalled by a bearing 73, and is adapted to be rotated by a motor 74 mounted on the bottom plate 29. The feed screw 72 is made to pierce through an elevator 78 which is elevatably mounted to the rail 68 by means of bearings 76. The elevator 78 is in the form of an arm extending horizontally. The rails 68, the feed screw 72, the motor 74 and the elevator 78 constitutes a second elevator device. This elevator device also transfers the wafer container to the process tube.

A pair of support members 80 which are spaced from each other and in parallel with each other, are secured on the lower plate 64 on which the frames 66 are fixed, with the elevator 78 being arranged between the support members 80, rails 82 are attached vertically on each of the surface of the support members 80 facing each other. An elevating plate 86 is mounted elevatably to the rails 82 through the intermediary of bearings 84. Incidentally, the elevating plate 86 is formed in a cut-out part 86a which is located above the elevating plate 78 so as to face the latter.

Meanwhile, a feed screw 90 adapted to be rotated by a motor 88 is attached to one of the support members 80, and is threadedly engaged with a projecting piece 91 attached to the elevating plate 86. The rails 82, the elevating plate 86, the motor 88 and the feed screw 90 constitute a vertically moving device as a first elevating means.

Further, a pair of rails 92 which are spaced in parallel with each other are secured to the upper surface of the elevating plate 86 in parallel with the above-mentioned support members 80. Arms, 94b are movably fitted in the rails 92, respectively, and are coupled together through the intermediary of a coupling member 94a. On the elevating plate 86 there is provided a feed screw 96 adjacent to and parallel with one of the rails 94, the feed screw 96 being journalled to bearing 98, and adapted to be rotated by a motor 100. The feed screw 96 is threadedly engaged with a projecting piece 102 projected from the one of the arms 94, piercing therethrough. The arms 94b, the feed screw 96 and the motor 100 constitute a slide device as a slide means.

Figure 9:
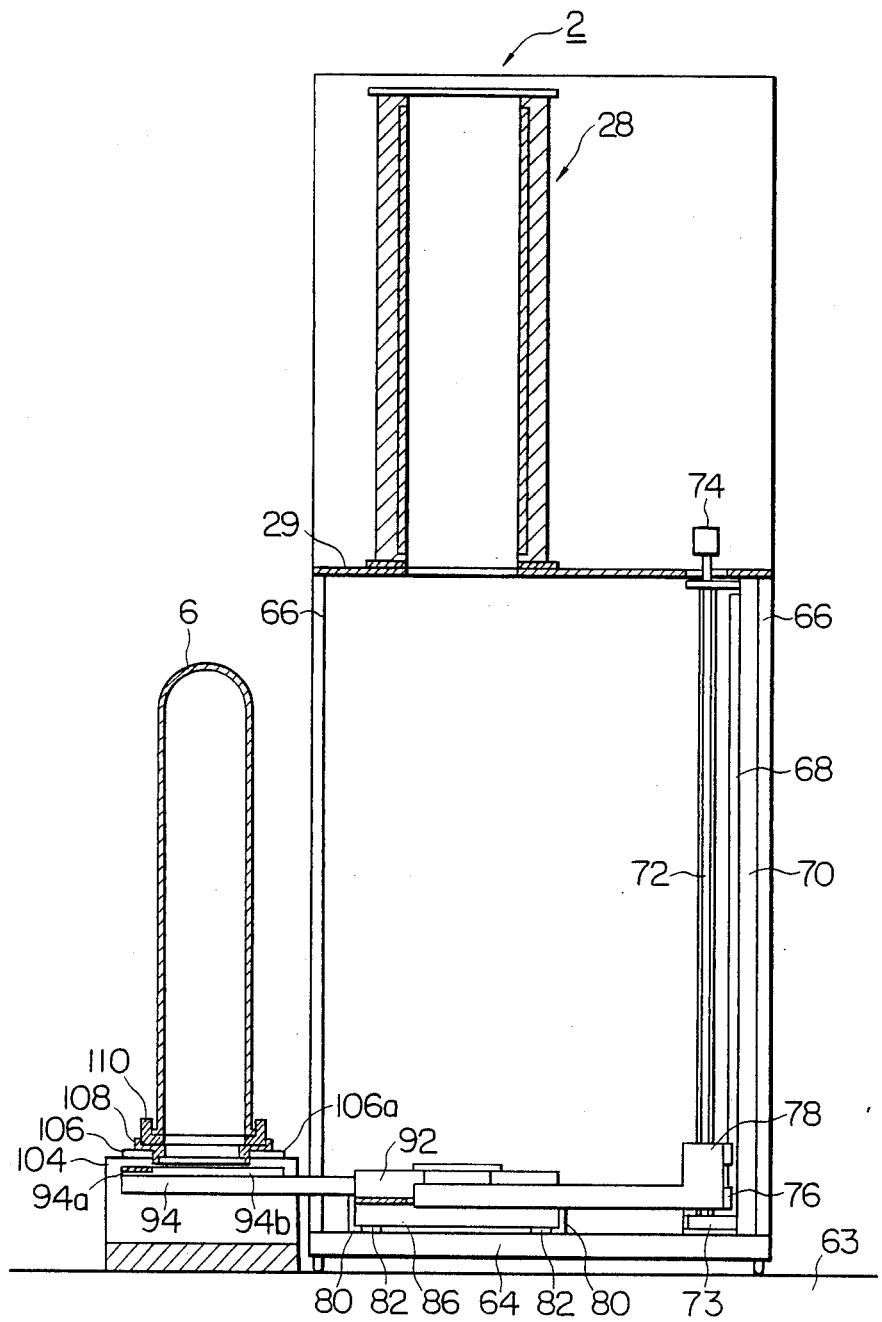
FIGS. 9 through 11 are front views illustrating a device for transferring the process tube and indicating the step order of the installation operation of the process tube onto the body.
Figure 10:
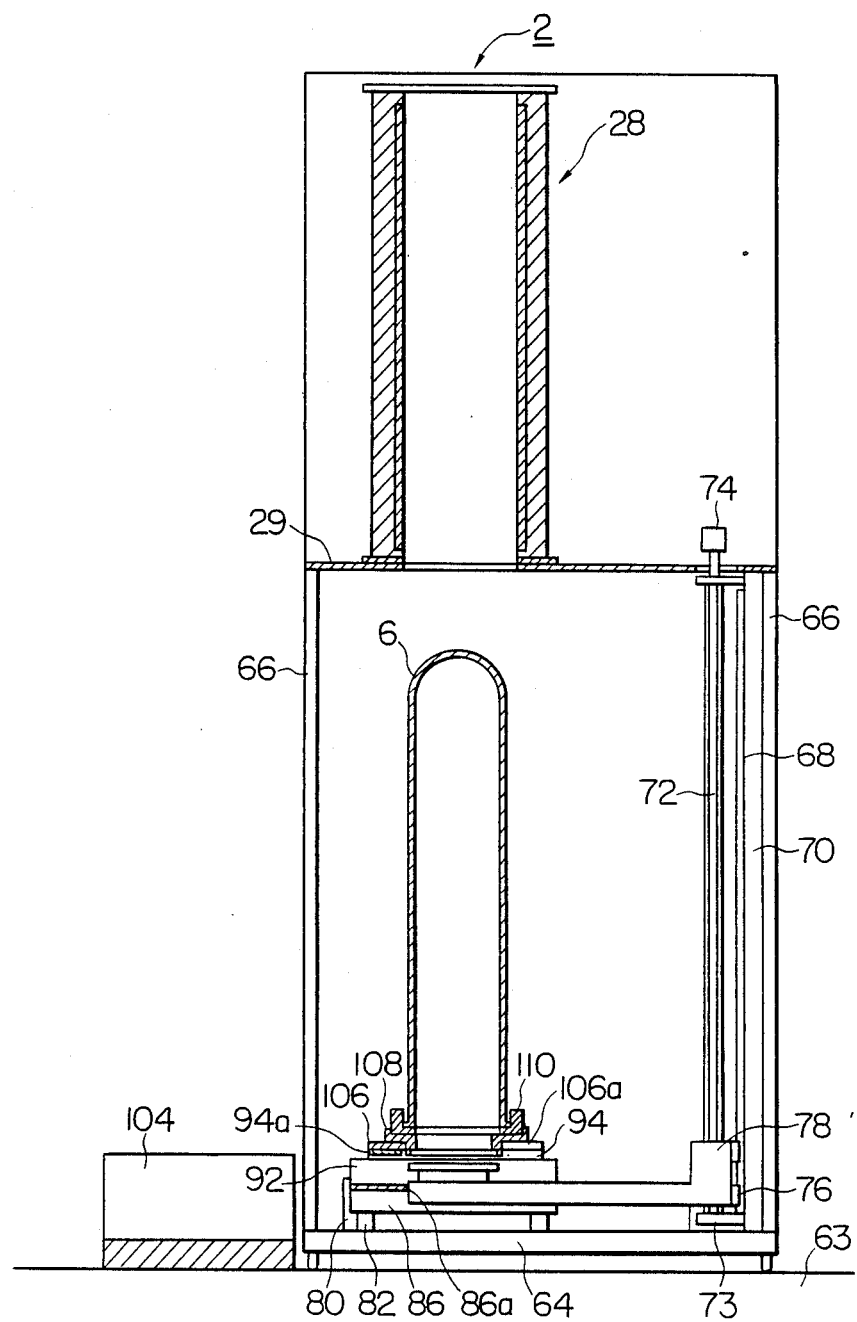
Figure 11:
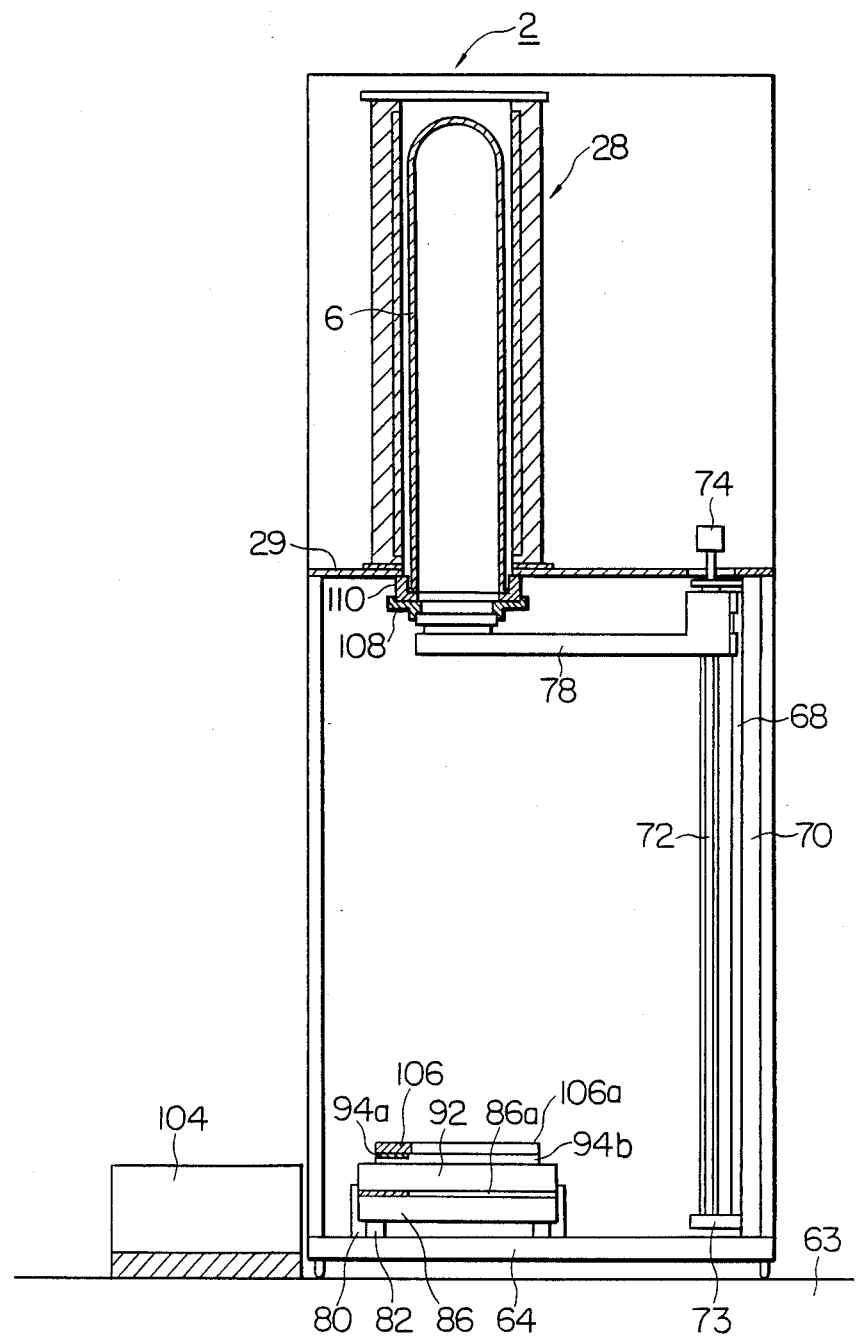

Further, as shown in FIGS. 9 through 11, a receiving and delivering bed 104 is arranged on the floor 63 at a position on the forward side of the above-mentioned slide device as viewed in the forward slide direction of the arms 94b, outside of and adjacent to the frames 66, and a jig plate 106 is set on the upper surface of the receiving and delivering bed 104. Incidentally, the width of the jig plate 106 is set to be greater than the space between the above-mentioned arms 94b. The jig plate 106 is formed therein with a cut-out part 106a at the center between the arms, 94b, and an installing and removing jig 108 is fitted removably in the cut out part 106a. Further, the above-mentioned process tube 6 is held upright on the installing and removing jig 108. A support ring 110 is attached to the lower end of the process tube 6, and is fitted in the installing and removing jig 108.

Next explanation will be made of the mounting of process tube 6 in the inside of the body 2.

As shown in FIG. 9, the process tube 6 is conveyed by a carrier vehicle or the like to the receiving and delivering bed 104 arranged outside of and in the vicinity of the frames 66, and is then held upright on the installing and removing jig 8 which is arranged on the receiving and delivering bed 104. Then, the motor 100 of the slide device is driven to rotate the feed screw 96 so as to allow the one of the arms 94 to slide forward along the associated rail 92 from the frames 66 to the receiving and delivering bed 104 arranged outside of the frames 66, in the horizontal direction by means of the projecting piece 102, and simultaneously, the other of the arms 94b is also slid forward by means of the coupling member 94a. After these arms are slid forward to a position below the receiving and delivering bed 104, the motor 88 of the vertically moving device is driven to rotate the feed screw 90 so as to elevate the elevating bed 86 by means of the projecting piece 91. Due to the elevation of the elevating plate 86, the arms 94, 94b are elevated to support the jig plate 106 set on the receiving and delivering bed 104. That is, it supports the process tube 6 through the intermediary of the installing and removing jig 108.

In this condition, the feed screw 96 is rotated in the reverse direction by means of the motor 100 so as to allow the arms 94, 94b to slide rearward along the rails 92 in the horizontal direction from the outside to the inside of the frames 66. Therefore, the jig plate 106 supported on the arms 94, 94b and the process tube supported on the installing and removing jig 108 are retracted into the inside of the frames 66 (FIG. 10).

Further, the motor 74 is driven to rotate the feed screw 72 so as to elevate the elevator 78 along the rails 68. As the elevator 78 ascends, the elevator 78 passes through the cut-out part 86a in the elevating plate 86, and abuts against the installing and removing jig 108 fitted in the cut-out part 106a in the jig plate 106 so as to lift up the jig 108 from the jig plate 106, thereby lifting up the process tube 6. The elevator then goes through the cut-out part 106a in the jig plate 106 and ascends further to introduce the process tube 6 in the inside of the furnace body before it is stopped. In this phase, the worker manually secures the process tube 6 and the support ring 110 on the upper plate of the frames (FIG. 11).

Thereafter, the motor 74 is driven to reversal rotate the feed screw to lower the elevator 78 down to the lowermost position, and jig plate 106 is removed from the elevator 78.

Thus, it is possible to move the process tube from the outside of the frames 66 and to mount the same on the body 2 without relying upon human hands.

When the process tube 6 is removed from the body in order to to replace the process tube 6 with another one, the steps are carried out in the order reverse to that mentioned above, and therefore, the process tube 6 can be moved from the body 2 to the outside of the frames 66 also without relying upon human hands.

Thus, it is possible to move the process tube 6 and to mount and remove the process tube 6 into and from the body without relying upon the human hands, and therefore, it is possible to facilitate the movement operation of the process tube 6, thereby it is possible to enhance the economy of the operation and as well to enhance the safety of the working.

What is claimed is:

1. A heat treatment apparatus, comprising;
    a furnace;
    a process tube adapted to be introduced into said furnace from the lower side of the latter;
    slide means for supporting said process tube by arms arranged in a space section below said furnace, and for horizontally reciprocating said arms between said space section below said furnace and a position outside of said space section, where said process tube is located;

first elevating means disposed in said space section below said furnace for elevating and lowering the arms of said slide means; and second elevating means for receiving and delivering said process tube supported by the arms of said slide means with the use of an elevator, and for elevating and lowering said process tube supported on said elevator relative to said furnace.

2. The apparatus of claim 1, wherein said heat treatment apparatus is a vertical heat treatment apparatus.

3. A heat treatment apparatus, comprising:

a body disposed adjacent to a clean room, said body having at least one surface adjacent the clean room and at least one surface facing away from the clean room;

a furnace disposed in said body;

means for elevating a process tube relative to said furnace;

means for defining a first opening in the surface facing away from the clean room;

first mans for closing said first opening;

means for defining a second opening in the surface adjacent to the clean room;

second means for closing said second opening to prevent contaminants from entering the clean room.

4. The heat treatment apparatus according to claim 3, wherein said first means is a maintenance door.

5. The heat treatment apparatus according to claim 3, wherein said second means closes said second opening while the process tube is removed.

6. The heat treatment apparatus according to claim 3, wherein said second means is arranged to prevent contaminants from streaming into the clean room by closing said second opening.

7. The heat treatment apparatus according to claim 3, wherein the process tube is vertically elevatable into said furnace, thereby forming a vertical heat treatment apparatus.

8. The heat treatment apparatus according to claim 7, wherein said second opening is disposed in a lower portion of the body, and said furnace is disposed in an upper portion of the body.

9. The heat treatment apparatus according to claim 3, wherein said second means is operated manually.

10. The heat treatment apparatus according to claim 3, wherein said second means is operated by a motor.

11. A vertical heat treatment apparatus for treating wafers comprising:

a fixed cylindrical furnace having a first opening in a lower end thereof;

a process tube having a second opening in a lower end thereof;

means for supporting said process tube when said process tube is inside said furnace;

an elevator device for loading or unloading wafers through said second opening;

said process tube being removably mounted in said supporting means;

said elevator device elevating said process tube between a first position where said process tube is inside said furnace and a second position where said process tube is outside said furnace;

said supporting means supporting said process tube in said first position in which said process tube is elevated by said elevator device;

said process tube being removed from said supporting means and being moved from said first position to said second position by said elevator device, in order to remove said process tube from said furnace.

12. The vertical heat treatment apparatus according to claim 1, wherein said supporting means is a plate member mounted in a body.

* * * * *